United States Patent [19]

Yoshihara

[11] Patent Number: 4,963,918
[45] Date of Patent: Oct. 16, 1990

[54] IMAGE FORMING APPARATUS FOR REPRODUCING IMAGES ON PHOTOSENSITIVE MEDIUM BY EXPOSING THE MEDIUM TO RADIATION THROUGH IMAGE-BEARING ORIGINAL

[75] Inventor: Hideo Yoshihara, Kasugai, Japan

[73] Assignee: Brother Kogyo Kabushiki Kaisha, Aichi, Japan

[21] Appl. No.: 239,269

[22] Filed: Sep. 1, 1988

[30] Foreign Application Priority Data

Sep. 3, 1987 [JP] Japan .................................. 62-220978
Sep. 10, 1987 [JP] Japan .................................. 62-138778

[51] Int. Cl.⁵ ............................................ G03B 27/00
[52] U.S. Cl. .................................................... 355/19
[58] Field of Search ..................... 355/19, 27, 32, 44, 355/45, 46, 49, 66, 88, 89, 133; 430/138

[56] References Cited

U.S. PATENT DOCUMENTS 2,206,396  7/1940  Glass et al. ............................ 355/19
2,478,980  8/1949  Pratt et al. ............................ 355/19
4,399,209  8/1983  Sanders et al. ...................... 430/138

*Primary Examiner*—Brian W. Brown
*Attorney, Agent, or Firm*—Oliff & Berridge

[57] ABSTRACT

An image forming apparatus, including a first holding device for positioning and holding a photosensitive recording medium at an exposing position, a light source for generating a radiation for exposing the recording medium, a second holding device for positioning and holding a contact-exposure original bearing a first image thereon, substantially in contact with the recording medium, a third holding device for positioning and holding a focus-exposure original bearing a second image thereon, at a position in an optical path between the exposing position and the light source, and a projector lens disposed in a portion of the optical path between the third holding means and the exposing position.

10 Claims, 2 Drawing Sheets

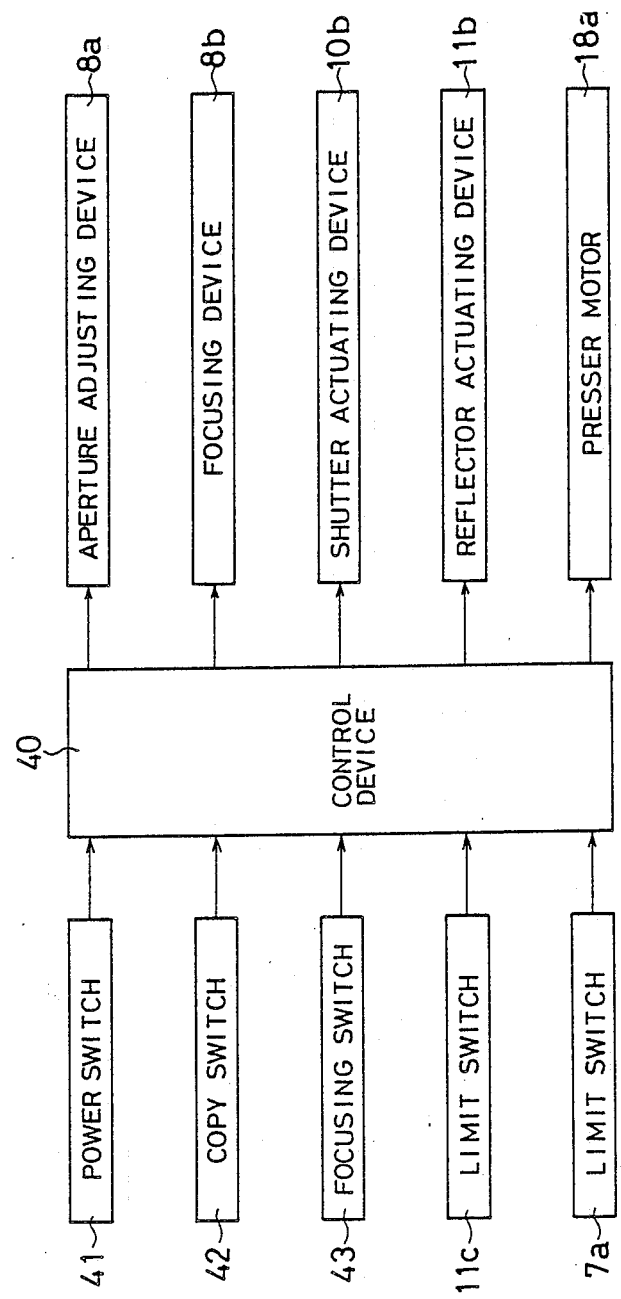

IMAGE FORMING APPARATUS FOR REPRODUCING IMAGES ON PHOTOSENSITIVE MEDIUM BY EXPOSING THE MEDIUM TO RADIATION THROUGH IMAGE-BEARING ORIGINAL

BACKGROUND OF THE INVENTION

1. Field of the Invention

The present invention relates in general to an apparatus for reproducing images on a photosensitive recording medium by imagewise exposing the medium to a radiation influenced by an image on an original, and more particularly to such an apparatus capable of selectively practicing two different exposing methods wherein the original is differently positioned relative to the medium, namely, either spaced apart from the medium or superposed on the medium substantially in contact therewith.

2. Discussion of the Related Art

In the art of reproducing images on a photosensitive recording medium, the above two different exposing methods are known. In the first method, the original which bears an image to be reproduced is positioned in spaced-apart relation with the medium, and the original is irradiated with a radiation produced by a suitable light source. The medium is exposed to the radiation which is reflected by or transmitted through the original. The radiation is converged on the surface of the medium, through a suitable focusing lens, so that the image on the original is optically focused on the surface of the medium. Thus, the medium is imagewise exposed to the radiation. In this exposing method, the original is referred to as "focus-exposure" original, which is usually a slide film or transparency (e.g., 35-mm film). In the second method, the original and the medium are superposed on each other such that the two members are substantially in contact with each other. The medium is imagewise exposed to a radiation through the original. In this method, the original is referred to as "contact-exposure" original, which is usually semi-transparent.

Up to the present, there is known no image forming apparatus which is capable of selectively practicing the above-indicated two different exposing methods by using a single or common light source device for the focus-exposure original and the contact-exposure original.

Where a single light source is used in combination with a focusing lens for converging a radiation from the light source on the surface of the remotely located photosensitive medium, through the focus-exposure original, the focusing lens is required to exhibit a high degree of optical focusing characteristic. However, when the recording medium is exposed to the radiation from the common light source through the contact-exposure original in contact with the medium, the focusing lens is required to permit transmission of a relatively large amount of light toward the photosensitive medium. In this respect, it is noted that the contact-exposure original may be a semi-transparent material such as an ordinary paper which bears a printed, drawn or written image, as well as a highly transparent slide film. Accordingly, the focusing lens should assure a relatively high level of illuminance on the surface of the contact-exposure original, rather than a high level of focusing accuracy as required in the exposing method using the focus-exposure original. Thus, the focusing lens used in combination with a single light source for both the focus-exposure original and the contact-exposure original is required to exhibit the two different optical characteristics, depending upon the exposing method. Where the lens permits transmission of a relatively large amount of light from the light source, the lens has comparatively small depth of focus and depth of field, and tends to cause poor focusing of the original image on the photosensitive medium. If the amount of light transmitted through the focusing lens is limited to assure high focusing accuracy, then a sufficient degree of illuminance cannot be obtained on the contact-exposure original, whereby the required exposing time is increased.

Where the common light source is used for the focus-exposure and contact-exposure originals, another problem may occur. That is, if the focus-exposure original is set in the apparatus while an image on the contact-exposure original is reproduced on the recording medium, the medium is exposed to the radiation which is influenced by the image on the focus-exposure original as well as the image on the contact-exposure original. In this case, the images on the two originals are superposed on the recording medium, unexpectedly to the user. In particular, the focus-exposure original, such as a 35-mm slide film or transparency, is usually small-sized and may frequently be overlooked when it is left in the apparatus. Further, it is relatively difficult to observe or perceive the content and posture of the image on the slide film, with naked eyes, and the wrong film may be set in the apparatus, or the film may be erroneously oriented or placed with the wrong side facing the light source.

SUMMARY OF THE INVENTION

It is therefore an object of the present invention to provide an image forming apparatus which is capable of reproducing an original image on a photosensitive medium, by selectively practicing two different exposing methods wherein the image-bearing original is differently positioned relative to the medium as discussed above, and wherein a common light source is used for the two exposing methods.

The above object may be achieved according to the principle of the present invention, which provides an image forming apparatus, comprising: first holding means for positioning and holding a photosensitive recording medium at an exposing position; a light source for generating a radiation for exposing the recording medium; second holding means for positioning and holding a contact-exposure original bearing a first image thereon, substantially in contact with the recording medium; third holding means for positioning and holding a focus-exposure original bearing a second image thereon, at a position in an optical path between the exposing position and the light source; and a projector lens disposed in a portion of the optical path between the third holding means and the exposing position.

In the image forming or reproducing apparatus of the present invention constructed as described above, both the contact-exposure original and the focus-exposure original may be selectively used to reproduce the desired original image on the photosensitive recording medium. In other words, the image-bearing original may be either positioned adjacent to or substantially in contact with the surface of the recording medium, or positioned a certain distance away from the medium. The recording medium is imagewise exposed to the radiation from the common light source, which has been transmitted through or reflected from the selected one of the two types of originals. Usually, an image forming operation on the instant apparatus is effected by using a desired one of the two different originals, the two originals may be simultaneously set in the apparatus. In this case, a composite image consisting of the images on the two originals ma be reproduced on the recording medium.

A second object of the invention is to provide such an image forming apparatus which permits accurate focusing of the original image on the recording medium where the focus-exposure original is used, and at the same time permits a comparatively reduced exposing time where the contact-exposure original is used.

The above object may be attained according to one form of the invention, wherein the apparatus further comprises an aperture adjusting device for adjusting an aperture of the projector lens such that the aperture is smaller when the recording medium is exposed to the radiation through the focus-exposure original, than when the recording medium is exposed to the radiation through the contact-exposure original. In this form of the invention, the useful opening or aperture of the projector lens is set to a comparatively small value when the exposure of the recording medium is effected through the focus-exposure original, so that the radiation which passes the lens is accurately converged on the surface of the recording medium. When the exposure is effected through the contact-exposure original adjacent to the medium, the aperture is set to a comparatively large value, so as to permit transmission of the radiation in a relatively large amount, so that a sufficient degree of illuminance is obtained on the surface of the contact-exposure original, whereby the exposure of the medium may be completed in a relatively short time.

A third object of the invention is to provide an image forming apparatus which is capable of selectively using the contact-exposure and focus-exposure originals and which permits the user to easily set the focus-exposure original in correct posture and to recognize the presence of the focus-exposure original set in the apparatus.

The above object may be accomplished according to another form of the invention, wherein the apparatus further comprises display means for displaying thereon the second image of the focus-exposure original which is positioned and held by the third holding means. In this form of the invention, the display means permits the operator to easily confirm the image on the focus-exposure original, and correctly position or orient the original with the right side facing the light source. Further, the display means lets the operator perceive the presence of the focus-exposure original set or left in the apparatus, thereby serving to avoid unexpected reproduction of a composite image on the recording medium due to exposure thereof to the radiation which is influenced by both of the contact-exposure and focus-exposure originals.

In one arrangement of the above form of the invention, the display means may comprise a viewing screen on which the second image is displayed, and a reflector disposed in a portion of the optical path between the projector lens and the exposing position. The reflector is operable between a first position in which the reflector reflects the radiation toward the viewing screen, and a second position in which the reflector permits transmission of the radiation along the optical path toward the exposing position. It is desirable that the reflector is normally placed in its first position so that the image on the focus-exposure original, if set in the apparatus, is viewed on the screen. Further, it is preferable that an optical length between the reflector and the viewing screen is equal to that between the reflector and the exposing position, so that the image as display on the viewing screen may be reproduced on the recording medium. In this case, the apparatus may further comprise operator-controlled focus adjusting means, and a focusing device operated responsive to the operator-controlled focus adjusting means, for focusing the second image on the viewing screen and the recording medium.

According to one feature of the above arrangement wherein the viewing screen and the reflector are provided, the apparatus may further comprise a power switch; a reflector actuating device for moving the reflector between the first and second positions; a shutter disposed in a portion of the optical path between the light source and the exposing position, and operable between an open and a closed position thereof; a shutter actuating device for operating the shutter between the open and closed positions; detecting means for generating a detection signal indicating that the reflector is placed in the first position; and a control device for determining, upon operation of the power switch, whether the detection signal is present or not. The control device is adapted to operate the reflector actuating device to move the reflector to the first position and operating the shutter actuating device to operate the shutter to the open position, if the detection signal is not present. If the detection signal is present, the control device operates the shutter actuating device to operate the shutter to the open position without operating the reflector actuating device. In this case, therefore, the reflector is placed in the first position while the shutter is held open, in the initial state of the apparatus upon power application. Accordingly, the focus-exposure original if left in the apparatus may be displayed on the viewing screen, prior to starting an image forming operation.

According to another feature of the same arrangement, the apparatus further comprises a start switch to command the start of an image forming operation, and a control device responsive to the start switch, for operating the shutter actuating device to operate the shutter to the closed position, operating the reflector actuating device to move the reflector to the second position, and then operating the shutter actuating device to operate the shutter to the open position.

According to a further feature of the above arrangement, the optical path includes a substantially horizontally extending portion following an initial portion which extends from the light source to the projector lens through the third holding means. The reflector placed in the first position is positioned in the substantially horizontally extending portion of the optical path such that the reflector is inclined so as to reflect the radiation upward toward the viewing screen. In this case, the image forming apparatus further comprises another reflector disposed in a portion of the optical path between the reflector and the exposing position. The reflector is inclined so as to reflect the radiation upward toward the recording medium which is positioned substantially horizontally by the first holding means, and the viewing screen is positioned between the light source and the first and second holding means, in a horizontal direction.

In the above case, the apparatus may be adapted to have a first inlet for introducing the contact-exposure original toward the second holding means, and a second inlet for introducing the focus-exposure original toward the third holding means. The first inlet is positioned between the viewing screen and the first and second holding means, while the second inlet is positioned such that the viewing screen is positioned between the first and second inlets. Since the first and second holding means for holding the recording medium and contact-exposure original occupy a relatively large space, these holding means may be suitably housed in one half of the apparatus while the first and second inlets and the viewing screen are conveniently located on the other half of the apparatus. The above-indicated positional relation of the inlets and the screen permits easy access to the inlets, and ready observation of the image displayed on the viewing screen.

BRIEF DESCRIPTION OF THE DRAWINGS

The above and other objects, features and advantages of the present invention will be better understood by reading the following detailed description of a presently preferred embodiment of the invention, when considered in connection with the accompanying drawings, in which:

FIG. 2 is a block diagram showing a control system of the apparatus of FIG. 1.

DETAILED DESCRIPTION OF THE PREFERRED EMBODIMENT

Figure 1:
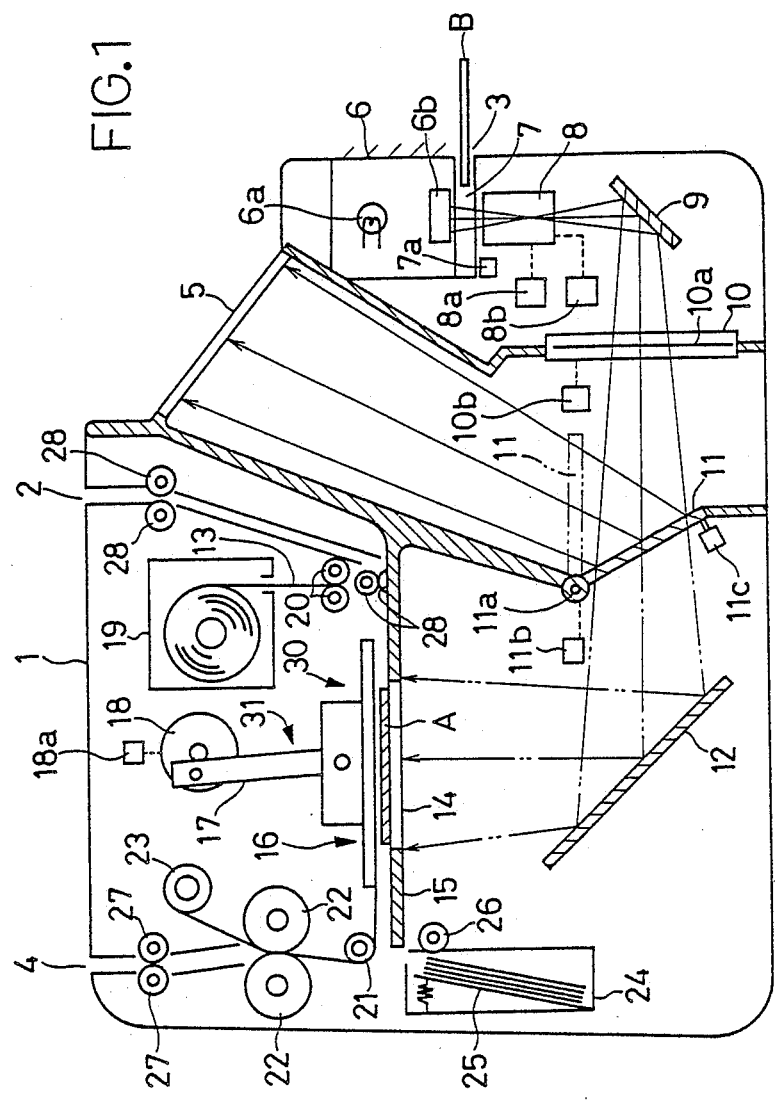
FIG. 1 is a schematic elevational view of an image forming apparatus embodying the present invention.

Referring first to FIG. 1, the image forming apparatus is indicated generally at 1. In an upper part of the apparatus 1, there is formed a first inlet 2 for introducing a first original A which bears an image to be reproduced. Since a photosensitive medium 13 (which will be described) is exposed to a radiation through the original A while the original A is held in contact with the medium 13, the original A will be referred to as "contact-exposure original". On one side of the image forming apparatus 1, there is formed a second inlet 3 for introducing another type of original B which also bears an image to be reproduced. Since the image on this original B is focused on the recording medium 13 while the medium 13 is exposed, the original B will be referred to as "focus-exposure original". In another upper part of the apparatus 1, there is formed an outlet 4 through which a copy sheet in the form of a developer sheet 25 (which will be described) bearing the reproduced image is ejected or discharged.

The instant image forming apparatus 1 is provided with a display device which includes a viewing screen 5 on which the image on the focus-exposure original B is displayed. The apparatus 1 incorporates a light source unit 6 which includes a halogen lamp 6a, and a condenser lens 6b. Below the condenser lens 6b of the light source unit 6, there is disposed a slide holder 7 for positioning and holding the focus-exposure original B such that a radiation produced by the light source unit 6 passes through the original B. The slide holder 7 has a suitable means such as a sheet spring which holds the original B under a biasing action thereof. For example, the focus-exposure original B is a 35 mm slide film or transparency. The slide holder 7 is provided with a limit switch 7a which generates a signal indicating that the original B is positioned in place in the slide holder 7.

Below the slide holder 7, there is provided a projector lens 8 whose aperture is adjustable by an aperture adjusting device 8a. The position of the projector lens 8 is adjustable by a focusing device 8b, in a direction of propagation of the radiation through the lens 8, i.e., in the direction parallel to an initial portion of an optical path which originates from the light source unit 6 and terminates in the recording medium 13. The optical path is bent by a reflector mirror 9 disposed below the projector lens 8. Namely, the reflector mirror 9 reflects the radiation such that the reflected radiation propagates along a horizontal portion of the optical path. In this horizontal portion, there is disposed a shutter 10 which includes a shutter diaphragm 10a which is operated by a shutter actuating device 10b, so that an amount of light that passes through the shutter is adjusted by changing a time during which the diaphragm 10a is placed in its open position. When the diaphragm 10a is placed in its closed position, the shutter 10 prevents the radiation of the light source unit 6 from reaching the photosensitive recording medium 13.

The image forming apparatus 1 further incorporates a reflector 11 which is supported by a pivot shaft 11a pivotally between a first position indicated in solid line in FIG. 1, and a second position indicated in broken line in the same figure. The reflector 11 is operated between these two positions by a reflector actuating device 11b, and is positioned such that the reflector 11 placed in its first position is disposed in the horizontal portion of the optical path. A limit switch 11c is provided to detect the first position of the reflector 11. The reflector 11 placed in the first position is inclined so as to reflect the radiation from the shutter 10, toward the viewing screen 5. In the second position, the reflector 11 permits the radiation from the shutter 10 to propagates along the horizontal portion of the optical path, which terminates in a second reflector mirror 12. This reflector mirror 12 is inclined so as to reflect the radiation toward the recording medium 13. The recording medium 13 is positioned and held by a holder device 30 such that the medium 13 is held in contact with the upper surface of the contact-exposure original A placed on a glass portion 14 of an original support plate 15. Described more specifically, the holder device 30 includes the support plate 15, and a presser mechanism 31 which includes a contact plate 16 for forcing the recording medium 13 against the surface of the original A, a connecting rod 17 fixed at its on end to the contact plate 16, and a drive gear 18 connected to the other end of the connecting rod 17 such that the connecting rod 17 is reciprocated when the drive gear 18 is rotated. The drive gear 18 is driven by a presser motor 18a.

The photosensitive recording medium 13 takes the form of a roll of a pressure-sensitive photosensitive web accommodated in a roll cassette 19. In the present embodiment, the recording medium 13 is a single-color photosensitive web according to U. S. Pat. No. 4,399,209. However, other types of photosensitive medium may be used in the optical system of the instant apparatus 1, with some modifications made to an image fixing arrangement which includes a pair of presser rolls 22 (which will be described).

The photosensitive web 13 is fed from the cassette 19 by a pair of pinch rolls 20, and passed along a path between the contact plate 16 of the presser mechanism 31 and the original support plate 15 (between the contact plate 16 and the contact-exposure original. A, if the original A is placed on the plate 15). The path of the photosensitive web 13 is bent upward by a guide roll 21 disposed to the left of the contact plate 16, so that the web 13 is passed through a pressure nip defined by the pair of presser rolls 22, 22 which serve to develop a latent image formed on the web 13 and fix the developed visible image formed on a developer sheet 25 (which will be described). The web 13 is then re-wound on a take-up roll 23 disposed above the presser rolls 22. Below the feed roll 21, there is disposed a developer sheet cassette 24 in which a stack of the developer sheets 25 is accommodated. The developer sheets 25 are delivered one at a time from the cassette 24 by a feed roll 26, such that the developer sheet 25 is superposed on an imagewise exposed portion of the web 13, before the sheet 25 and the exposed portion of the web 13 are passed through the nip of the presser rolls 22. The developer sheet 25 which leaves the presser rolls 22 is ejected by a pair of ejector rolls 27, 27 through the outlet 4. Adjacent to the first inlet 2, a pair of supply rolls 28 are provided to feed the contact-exposure original A onto the original support plate 15.

Referring next to FIG. 2, there is shown a control device 40 which controls various electrically operated elements including those which have been described. Described more specifically, the control device 40 is connected to the aperture adjusting device 8a and the focusing device 8b which are connected to the projector lens 8. The control device 40 is further connected to the shutter actuating device 10b and the reflector actuating device 11b which are connected to the shutter 11 and the reflector 11, respectively. The control device 40 is also connected to the presser motor 18a for operating the drive gear 18 of the presser mechanism 31. The above devices 8a, 8b, 10b, 11b and motor 18a are controlled by the control device 40, based on input signals received from: a POWER switch 41 for applying power to the apparatus 1; a COPY switch 42 for starting an image forming or reproducing operation on the apparatus 1; two FOCUS ADJUSTING switches 43 for adjusting the position of the projector lens 8; the limit switch 11c which generates a detection signal indicative of the first position of the reflector 11; and the limit switch 7a which generates a detection signal indicating that the focus-exposure original B is positioned in place in the slide holder 7.

There will next be described image forming operations on the instant image forming apparatus 1.

When the POWER switch 41 is turned on, the control device 40 determines, based on the signal from the limit switch 11c, whether the reflector 11 is placed in its first position indicated in solid line in FIG. 1. If the reflector 11 is placed in its second position out of the optical path, then the control device 40 commands the reflector actuating device 11b to pivot the reflector 11 from the second position to the first position. Then, the control device 40 commands the shutter actuating device 10b to operate the shutter diaphragm 10a to its open position. Therefore, irrespective of the presence of the focus-exposure original B in the slide holder 7, the radiation produced by the light source unit 6 reaches the viewing screen 5 via the projector lens 8, reflector mirror 9, shutter 10, and reflector 11. If the original B is positioned in the slide holder 7, the image on the original B is displayed on the viewing screen 5.

When the focus-exposure original B is inserted through the second inlet 3 into position in the slide holder 7, the image on the original B is displayed on the viewing screen 5. At the same time, the limit switch 7a generates a signal indicating that the apparatus is loaded with the original B, and the control device 40 operates the aperture adjusting device 8a so that the aperture of the projector lens 8 is smaller than when an image forming operation is effected by using the contact-exposure original A placed on the original support plate 15. The reduced aperture of the projector lens 8 permits improved accuracy of focusing of the image of the original B on the photosensitive recording medium 13. While the amount of light that is transmitted through the projector lens 8 in this instance is reduced, the reduced amount of light does not matter, since the focus-exposure original B is usually a slide film or transparency which has a high degree of light transparency.

In the above condition wherein the reflector 11 is placed in its first position, the position of the projector lens 8 in the direction of propagation of the radiation therethrough is adjusted by the FOCUS ADJUSTING switches 43, in order to precisely focus the image of the original B on the recording medium 13. More specifically, the appropriate one of the two FOCUS ADJUSTING switches 43 is operated to command the focusing device 8b to move the projector lens 8 in the appropriate direction, so that the image of the original B can be clearly seen on the viewing screen 5. Since an optical length between the projector lens 8 and the viewing screen 5 is equal to that between the projector lens 8 and the recording medium 13, the focusing operation with the switches 43 while viewing the image displayed on the screen 5 permits precise focusing of the image on the recording medium 13.

Upon activation of the COPY switch 42, the presser motor 18a is operated to rotate the drive gear 18 to thereby lower the contact plate 16, whereby a portion of the photosensitive web 13 is held in pressed contact with the upper surface of the glass portion 14 of the support plate 15. Thus, the appropriate portion of the web 13 is set in the predetermined exposing position.

In the next step, the control device 40 commands the shutter actuating device 10b to operate the shutter diaphragm 10a to its closed position, and commands the reflector actuating device 11b to pivot the reflector 11 to its second position to permit the radiation from the light source unit 6 to pass from the shutter 10 to the reflector mirror 12, when the shutter 10 is open. After the reflector 1 is retracted to the second position, the shutter actuating device 10b is again commanded to move the diaphragm 10a to its open position. The diaphragm 10a is maintained in the open position for a suitable length of time. During this length of time, the photosensitive recording medium 13 is exposed to radiation which has passed through the original B, projector lens 8 and shutter 10 and which has been reflected by the reflector mirrors 9 and 12. Thus, the recording medium 13 is imagewise exposed to the radiation which represents the image on the original B, whereby a latent image is formed on the exposed portion of the medium 13. Then, the diaphragm 10a of the shutter 10 is moved to its closed position, and the reflector 11 is returned to its original first position.

After the reflector 11 is returned to the first position, the shutter diaphragm 10a is again moved to the open position, whereby the image of the original B is displayed on the viewing screen 5. In the meantime, the latent image formed on the imagewise exposed portion of the recording medium 13 is developed into a visible image on the developer sheet 25, in the following manner.

The contact plate 16 of the presser mechanism 31 is moved upward away from the recording medium 13, and the medium 13 is advanced by the pinch rolls 20 and take-up roll 23. The developer sheet 25 is superposed on the exposed portion of the medium 13 when that exposed portion reaches the guide roll 21. The superposed medium 13 and developer sheet 25 ar passed through the pressure nip between the presser rolls 22, whereby the latent image on the photosensitive medium 13 is developed into a visible image formed on the developer sheet 25, as well known in the art. The exposed portion of the medium or web 13 is re-wound on the take-up roll 23, while the developer sheet 25 which bears the reproduced image is ejected through the outlet 4 by the ejector rolls 27.

An image forming operation by using the contact-exposure original A will then be described.

When the original A is inserted into the first inlet 2, the operator may observe the viewing screen 5, to check if the focus-exposure original B is in the slide holder 7, or not. That is, the reflector 11 is placed in the first position and the shutter 10 is open, in the initial state of the apparatus 1, as described above. With the original A inserted in the first inlet 2, the COPY switch 42 is operated to feed the original A to the predetermined exposing position on the support plate 15. Further, the appropriate portion of the photosensitive web or medium 13 is pressed against the original A by the contact plate 16 of the presser mechanism 31, in the same manner as described above. In the present case wherein the original B is absent in the slide holder 7, the control device 40 determines, based on the signal from the limit switch 7a, that the contact-exposure original A is used in place of the focus-exposure original B. As a result, the control device 40 commands the aperture adjusting device 8a such that the aperture of the projector lens 8 is enlarged to increase the amount of light that can be transmitted through the lens 8, so that the contact-exposure original A is irradiated with a comparatively large amount of light. For instance, the aperture of the lens 8 is set to its maximum value.

The following equation (1) represents illuminance E of a real image formed in a plane perpendicular to an optical axis of a lens system:

$$E = \frac{\tau \pi L}{4} \times \frac{(\phi/f)^2}{(1 + \beta)^2} \quad (1)$$

It follows from the above equation (1) that the illuminance of the image is proportional to the second power of the effective diameter of the lens, namely, the aperture of the projector lens 8 in the present case.

After the recording medium 13 is pressed against the contact-exposure original A and the aperture of the lens 8 is adjusted as described above, the shutter 10 is closed, and the reflector 11 is moved to its second position. Then, the shutter 10 is held open for the predetermined time duration, to permit the radiation from the light source unit 6 to imagewise expose the photosensitive medium 13 through the original A. After the predetermined time of exposure of the medium 13 through the original A, the shutter 10 is closed, and the reflector 11 is returned to the original first position. Then, the shutter 10 is again opened. Accordingly, the viewing screen 5 is irradiated with radiation from the light source unit 6. The latent image formed on the imagewise exposed portion of the medium 13 is developed into a visible image in the developer sheet 25, in the same manner as described above.

Since the single light source unit 6 is used for the contact-exposure and focus-exposure originals A and B, the instant image forming apparatus 1 is capable of reproducing a composite image on the recording medium 13, by exposing the medium 13 to the radiation which has passed both the focus-exposure original B and the contact-exposure original A.

While the present invention has been described in its presently preferred embodiment, it is to be understood that the invention is not limited to the details of the illustrated embodiment, but may be embodied with various changes, modifications and improvements which may occur to those skilled in the art. For example, the pressure-sensitive photosensitive web used as the recording medium 13 in the illustrated embodiment may be replaced by other types of photosensitive medium. Further, color imaging photosensitive media may be used to reproduce multi-color or full-color images. In this case, suitable color correction or separation filters are disposed in the optical path of the apparatus.

What is claimed is:

1. An image forming apparatus, comprising:
   first holding means for positioning and holding a photosensitive recording medium at an exposing position;
   single light source for generating a radiation for exposing said recording medium;
   second holding means for positioning and holding a contact-exposure original bearing a first image thereon, substantially in contact with said recording medium,
   third holding means for positioning and holding a focus-exposure original bearing a second image thereon;
   means for defining an optical path between said exposing position and said light source, both of said second holding means and said third holding means being disposed in said optical path; and
   said means for defining an optical path including a projector lens disposed in a portion of said optical path between said third holding means and said exposing position, such that said recording medium is imagewise exposed to said radiation which has passed through said projector lens and which has been influenced by at least one of said contact-exposure and focus-exposure originals, said radiation influenced by said contact-exposure original irradiating said recording medium for effecting a contact-exposure imaging of said first image, said radiation influenced by said focus-exposure original being focused by said projector lens on said recording medium, for effecting a focus-exposure imaging of said second image.

2. An image forming apparatus comprising:
   first holding means for positioning and holding a photosensitive recording medium at an exposing position;
   a light source for generating a radiation for exposing said recording medium;
   second holding means for positioning and holding a contact-exposure original bearing a first image thereon, substantially in contact with said recording medium, third holding means for positioning and holding a focus-exposure original bearing a second image thereon, at a position in an optical path between said exposing position and said light source;

a projector lens disposed in a portion of said optical path between said third holding means and said exposing position; and an aperture adjusting device for adjusting an aperture of said projector lens such that said aperture is smaller when said recording medium is exposed to said radiation through said focus-exposure original, than when said recording medium is exposed to said radiation through said contact-exposure original.

3. An image forming apparatus according to claim 1, further comprising display means for displaying thereon said second image of said focus-exposure original which is positioned and held by said third holding means.

4. An image forming apparatus comprising:
first holding means for positioning and holding a photosensitive recording medium at an exposing position;
a light source for generating a radiation for exposing said recording medium;
second holding means for positioning and holding a contact-exposure original bearing a first image thereon, substantially in contact with said recording medium,
third holding means for positioning and holding a focus-exposure original bearing a second image thereon, at a position in an optical path between said exposing position and said light source;
a projector lens disposed in a portion of said optical path between said third holding means and said exposing position; and
further comprising display means for displaying thereon said second image of said focus-exposure original which is positioned and held by said third holding means;
said display means comprising:
a viewing screen on which said second image is displayed; and
a reflector disposed in a portion of said optical path between said projector lens and said exposing position, and operable between a first position in which said reflector reflects said radiation toward said viewing screen, and a second position in which said reflector permits transmission of said radiation along said optical path toward said exposing position.

5. An image forming apparatus according to claim 4, wherein an optical length between said reflector and said viewing screen is equal to that between said reflector and said exposing position.

6. An image forming apparatus according to claim 5, further comprising:
operator-controlled focus adjusting means; and a focusing device operated responsive to said operator-controlled focus adjusting means, for focusing said second image on said viewing screen and said recording medium.

7. An image forming apparatus according to claim 4, further comprising:
a power switch;
a reflector actuating device for moving said reflector between said first and second positions;
a shutter disposed in a portion of said optical path between said light source and said exposing position, and operable between an open and a closed position thereof;
a shutter actuating device for operating said shutter between said open and closed positions;
detecting means for generating a detection signal indicating that said reflector is placed in said first position; and
a control device for determining, upon operation of said power switch, whether said detection signal is present or not, said control device operating said reflector actuating device to move said reflector to said first position and operating said shutter actuating device to operate said shutter to said open position, if said detection signal is not present, said control device operating said shutter actuating device to operate said shutter to said open position without operating said reflector actuating device is said detection signal is present.

8. An image forming apparatus according to claim 7, further comprising:
a start switch for commanding to start an image forming operation; and
a control device responsive to said start switch, for operating said shutter actuating device to operate said shutter to said closed position, operating said reflector actuating device to move said reflector to said second position, and then operating said shutter actuating device to operate said shutter to said open position.

9. An image forming apparatus according to claim 4, wherein said optical path includes a substantially horizontally extending portion following an initial portion which extends from said light source to said projector lens through said third holding means, said reflector placed in said first position being positioned in said substantially horizontally extending portion of said optical path such that said reflector is inclined so as to reflect said radiation upward toward said viewing screen, said image forming apparatus further comprising:
another reflector disposed in a portion of said optical path between said reflector and said exposing position, and inclined so as to reflect said radiation upward toward said recording medium which is positioned substantially horizontally by said first holding means,
said viewing screen being positioned between said light source and said first and second holding means, in a horizontal direction.

10. An image forming apparatus according to claim 9, further comprising a first inlet for introducing said contact-exposure original toward said second holding means, and a second inlet for introducing said focus-exposure original toward said third holding means, said first inlet being positioned between said viewing screen and said first and second holding means, while said second inlet being positioned such that said viewing screen is positioned between said first and second inlets.

* * * * *